United States Patent [19]

Kluitmans et al.

[11] Patent Number: 5,065,226
[45] Date of Patent: Nov. 12, 1991

[54] LASER DIODE MODULE

[75] Inventors: Johannes T. M. Kluitmans; Hindrik Tjassens; Hendrikus G. Kock, all of Eindhoven, Netherlands

[73] Assignee: U.S. Philips Corp., New York, N.Y.

[21] Appl. No.: 539,092

[22] Filed: Jun. 15, 1990

[30] Foreign Application Priority Data

Jun. 16, 1989 [NL] Netherlands ............... 8901523

[51] Int. Cl.$^5$ ................. H01L 23/02; H01L 23/12
[52] U.S. Cl. ........................... 357/74; 357/79; 357/80; 372/43; 372/38; 385/92
[58] Field of Search ............... 357/74, 76, 79, 80; 372/36, 38, 44, 45; 350/96.1, 96.2, 96.17; 333/246, 32

[56] References Cited

U.S. PATENT DOCUMENTS

| | | | |
|---|---|---|---|
| 4,309,717 | 1/1982 | Cardinal | 357/74 |
| 4,761,788 | 8/1988 | Dietrich et al. | 372/36 |
| 4,803,689 | 2/1989 | Shibanuma | 372/36 |
| 4,834,491 | 5/1989 | Aoki et al. | 350/96.20 |
| 4,873,566 | 10/1989 | Hokanson et al. | 357/74 |

OTHER PUBLICATIONS

"Dual-In-Line Laser Diode Module for Fiber-Optic Transmission Up to 4 Gbit/s", Journal of Lightwave Technology, vol. LT-5, No. 10, Oct. 87, pp. 1403–1411.

Primary Examiner—Rolf Hille
Assistant Examiner—D. Ostrowski
Attorney, Agent, or Firm—Steven R. Biren

[57] ABSTRACT

A laser diode module includes a rectangular box-shaped metal casing having a bottom (B), an even number of guide pins (1–14) being led through the bottom (B) in a standardized DIL order. In addition to the laser diode itself (LD) the laser diode module further includes a metal base carrier (BC) on which the laser diode (LD), a photo diode (PD) and a support (S) for the glass fiber (F) are installed. The laser diode module further includes a guide pin (9) which is inserted in the bottom (B) by means of a feedthrough insulator for electrically connecting the laser diode module to an external transmission line (MT). In order to achieve a proper matching of the laser diode module and the characteristic impedance of the external transmission line (MT), so that reflection phenomena are avoided and the laser diode module is made suitable for use in systems with considerably higher bit rates than 1 Gbit/s, the aforesaid guide pin (9) forms the inner guide of a coaxial transmission line situated inside the casing, of which transmission line the outer guide (CBL) is electrically conductively connected to the casing, whereas in the connecting line between the inner guide (9) and the laser diode (LD) a resistor (CS) is inserted having a value such that the sum of the resistances of this resistor (CS) and the laser diode (LD) is substantially equal to the characteristic impedance of the coaxial transmission line (9, CBL).

17 Claims, 8 Drawing Sheets

LASER DIODE MODULE

BACKGROUND OF THE INVENTION

The invention relates to a laser diode module comprising:

a rectangular box-shaped metal casing with a bottom, two long and two short side walls, a tubular passage for a glass fiber being provided in one of the short side walls, and at least six guide pins being passed through the bottom in a standardized DIL order, at least one of the guide pins being inserted in the bottom by means of electrically conductive material and the remaining guide pins being inserted in the bottom by means of feedthrough insulators, a sheet-like metal base carrier having a electrically conductive coupling with the casing, on which base carrier are mounted: a first subcarrier with a laser diode attached to it, a support for mounting the glass fiber in a manner such that its end faces the front facet of the laser diode and a second subcarrier with the photodiode attached to it, and connecting lines for connecting the laser diode, the photodiode and the metal base carrier to the respective guide pins.

In optical communication systems laser diode modules are used for electro-optical conversion of the electric data signals to be transferred, whereas systems with data bit rates of 140, 280 and 565 Mbit/s are already widely used. In the 565 Mbit/s systems a laser diode module having the configuration mentioned in the preamble has become a de facto standard.

In the field of optical communication there is a tendency towards bit rates increasing in the short term, according to which tendency systems having a bit rate of 2.4 Gbit/s are already being developed. With these increasing bit rates it appears that from about 1 Gbit/s not so much the laser diode itself, but rather the laser diode module as a whole forms the constraining factor. Therefore, every attention should be given to the electrical features of the complete laser diode module, specifically, its small-signal response and reflection coefficient.

In the transmitter of such a communication system a laser driving circuit is included which is connected to a laser diode module through an external transmission line. In this context a proper adjustment to the characteristic impedance of the transmission line is desirable at the two ends of this transmission line, because the lack of a proper adjustment will result in signal reflections between the driving circuit and the laser diode module which may lead to disturbances of the pulse shape of the data signals applied to the laser diode. Since the laser diode itself has a relatively low impedance, usually a resistor is inserted between the external transmission line and the signal input to the laser diode module, the resistance of this resistor being such that the impedance of the series connection of this resistor and the laser diode matches the characteristic impedance of the transmission line as much as possible.

For low bit rates of the data signals the adaptation by means of a resistor appears to be rather satisfactory. However, at increased bit rates the relatively large length of the connecting wires to the guide pins and the length of the guide pins themselves start playing an ever more important role in the laser diode module and the matching appears to degrade increasingly. The consequent reflection phenomena appear to augment as a function of frequency and hence the frequency range in which the laser diode module can be used with acceptable disturbances of the pulse shape of the data signals applied to the laser diode is limited.

A possible solution to achieve a proper adjustment to the characteristic impedance of the transmission line is completely redesigning the laser diode module for bit rates exceeding 1 Gbit/s. For this design the dimensioning of the casing and the order of guide pins fed through the casing are to be modified such that the electrical characteristics for higher frequencies are more favorable than with the standard module. This solution is not only costly, but is also accompanied with the disadvantage that the printed circuit board comprising the electric circuit elements to be connected to the laser diode module is to be re-designed, because the connecting pins for the module guide pins can in that case no longer be chosen according to a standardized DIL order.

SUMMARY OF THE INVENTION

It is an object of the invention to provide a laser diode module having the configuration described above and, more specifically, a standardized DIL order of the guide pins, which module counteracts the rapid increase of reflection phenomena as a function of frequency and, consequently, is suitable for use in systems operating at bit rates considerably higher than 1 Gbit/s.

The laser diode module according to the invention is characterised in that the guide pin for electrically connecting the laser diode, which pin is inserted in the bottom by means of a feedthrough insulator, forms inside the casing the inner guide of a coaxial transmission line whose outer guide is electrically conductive and connected to the casing, while in the connecting line between the inner guide and the laser diode a resistor is inserted having a value such that the sum of the resistances of this resistor and the laser diode is substantially equal to the characteristic impedance of the coaxial transmission line.

The invention is based on the recognition that the length of the guide pin portions inside the casing and the length of several connecting wires to the guide pins result in relatively high inductances which, with increasing frequencies, disturb in an ever more serious manner the matching of the laser diode module and the characteristic impedance of the transmission line. By using in the above manner a coaxial transmission line whose inner guide is formed by the guide pin for connecting the laser diode to the signal input of the laser diode module, the influence of the inductance of this guide pin on the matching of the laser diode module to the characteristic impedance of the external transmission line is eliminated virtually completely. With a given value of the dielectric constant of the medium between the guides the characteristic impedance of the internal coaxial transmission line is determined by the ratio between the outside diameter of the guide pin and the inside diameter of the outer guide of the coaxial transmission line. This ratio is now chosen in a manner such that the characteristic impedance of the internal coaxial transmission line is equal to the characteristic impedance of the external transmission line between the laser diode module and the laser driving circuit. The resistor which outside the casing was inserted between the signal input and the external transmission line in the original laser diode module is now, of necessity, positioned inside the casing so as to provide, in addition to the impedance of the laser diode, the best matching possible of the laser diode and the coaxial transmission line.

An embodiment of the laser diode module according to the invention is characterized in that the outer conductor has at least one flat side face which is electrically conductively connected over its entire surface to the associated long side wall of the casing.

In this manner a stray capacitance which is situated between the flat side face of the outer guide and the surface of the associated facing long side wall is eliminated. This stray capacitance would have a disturbing effect on the matching of the laser diode module and the characteristic impedance of the external transmission line.

In many applications the laser diode module also includes a thermal cooler with two thermal contact faces of which one contact face is thermoconductively coupled to the bottom of the metal casing and the other contact face is thermoconductively connected to the base carrier with attached to it a thermistor which is thermoconductively coupled thereto, and the laser diode module also includes connecting lines for connecting the thermistor and the thermoelectric cooler to the respective guide pins.

It appears that the presence of a thermoelectric cooler has a considerably disturbing effect on the electrical properties of the laser diode module for bit rates from approximately 1 Gbit/s. Especially the rather large dimensions of the technically available thermoelectric coolers and the relatively large length of several connecting wires to the guide pins play an important role.

The measures according to the invention enable to reduce considerably the disturbing effect of the thermoelectric cooler on the characteristics of the laser diode module, more specifically, respecting the reflection coefficient which is a measure for the occurrence of reflection phenomena.

For this purpose, a laser diode module having a thermoelectric cooler is further characterized in that inside the casing, in parallel with the long and short side walls, a rod of electrically conductive material is provided which, over its entire length, is electrically conductively connected to a long side wall of the casing, a electrically conductive coupling also being provided between the head face of the rod and the base carrier.

This rod is preferably also used for the outer guide of the coaxial transmission line and thereto has a circular cylindrical feedthrough for the inner guide which is formed by the guide pin concerned.

In the original laser diode module the length of the guide pin part inside the casing and that of several connecting wires results in relatively high inductances. The coupling between these inductances and the stray reactances of the thermoelectric cooler gives rise to undesired resonances which seriously degrade both the small signal response and the reflection coefficient of the laser diode module. By implementing the above measures in a laser diode module according to the invention, if a thermoelectric cooler is present, the disturbing effect of the thermoelectric cooler on the reflection coefficient of the laser diode module will be reduced considerably. These further measures result in the fact that the inductance of the link between the casing and the base carrier of the laser diode module has become considerably smaller. These further measures have already been described in Dutch Patent Application 8800140 as an effective means for improving the small signal response by reducing undesired resonances or shifting to higher frequencies. The present problem of the reflection phenomena which is the constraining factor for use of the laser diode module in systems having bit rates from about 1 Gbit/s, however, is not discussed at all in the above Patent Application.

In the practical implementation of the laser diode module according to the invention, the length of the rod-like outer guide of the coaxial transmission line electrically conductively connected to the casing can suitably be chosen to be substantially equal to the distance between the bottom of the casing and the top of the base carrier, because in that case a relatively short electrical connection between a head face of the rod-shaped outer guide and the base carrier will suffice. The inductance of this connection between the head face of the rod-shaped outer guide and the base carrier can still be further reduced by choosing the largest dimension of the rod-shaped outer guide in the direction perpendicular to the relevant side wall slightly smaller than the distance between this side wall and the facing side of the base carrier and bridging the interstice developed thus by means of a relatively wide connecting strip.

The rod-like outer guide preferably has an essentially rectangular cross-section so that the rod-like outer guide can be connected to the relevant side wall in a simple manner. The width of the flat side face of the rod-like outer guide, which face is connected to this side wall, is chosen such that undesired coupling to the remaining guide pins is avoided.

BRIEF DESCRIPTION OF THE DRAWINGS

The invention and its advantages will now be further explained on the basis of embodiments with reference to the drawing, in which.

DESCRIPTION OF THE PREFERRED EMBODIMENTS

Figure 1:
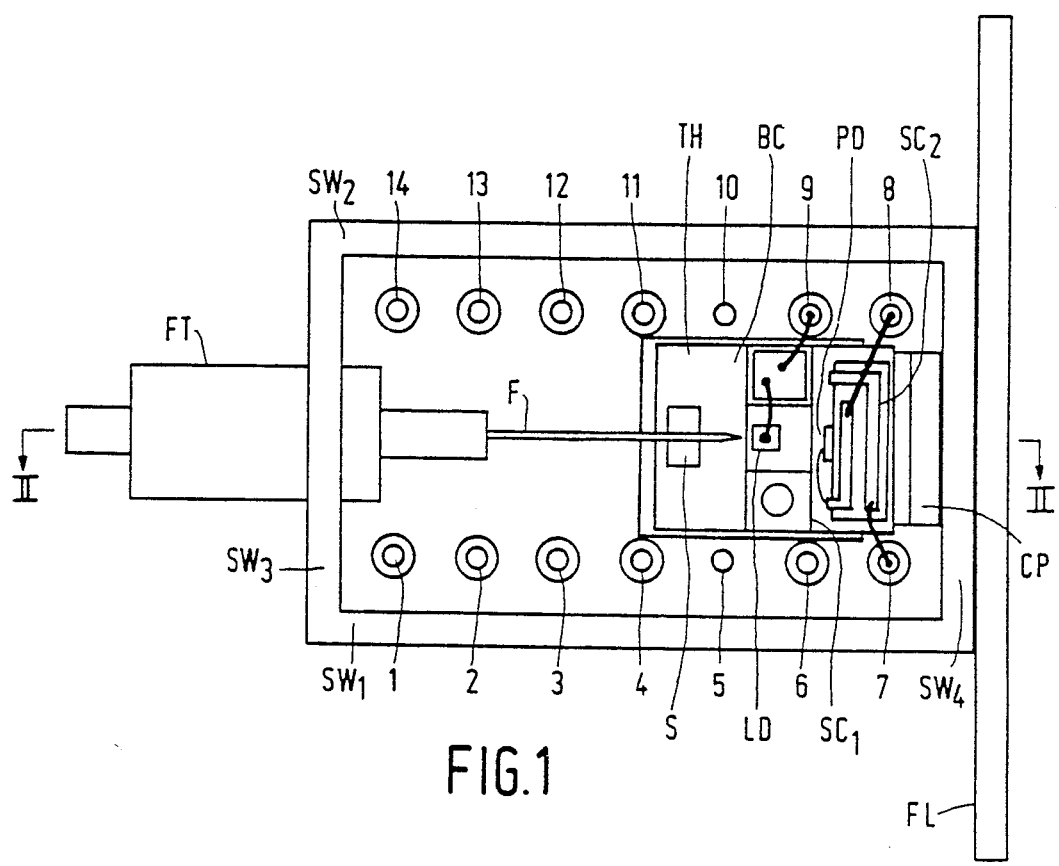
FIG. 1 shows a plan view of a laser diode module without a prior-art thermoelectric cooler.
Figure 2:
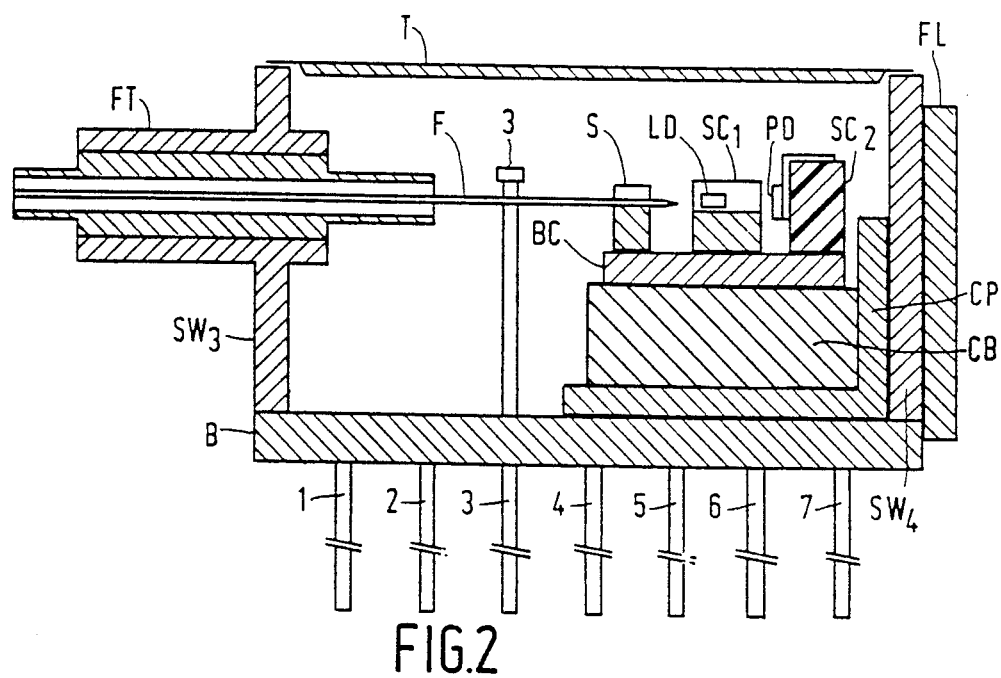
FIG. 2 shows a sectional view of the same laser diode module along line II—II in FIG. 1.

In optical communication systems for electric data signals having a bit rate of 565 Mbit/s a laser diode module is used which is represented in a somewhat simplified form in FIG. 1 and FIG. 2, in which FIG. 1 shows a plan view and FIG. 2 a sectional view along the line II—II.

This module comprises a rectangular box-like metal casing with a bottom B, two long side walls $SW_1$, $SW_2$ and two short side walls $SW_3$, $SW_4$, which casing can be closed by a lid T also made of metal. In the short side wall $SW_3$ there is provided a tubular feedthrough FT for a glass fiber F, in which the inner tube and the outer tube thereof are represented in FIG. 2 in diagrammatic outline. Fourteen guide pins 1-14 are passed through the bottom B in a standardized DIL order (Dual-In-Line), whereas the spacing of the centers of the pins in a line (1-7), (8-14) is fixed at 0.1 inch and a spacing of the lines (1-7), (8-14) is fixed at 0.3 inch, also measured between the centres of the pins. No less than one of the pins 1-14 is inserted in the bottom B by means of electrically conductive material and in practice this usually applies to the pins 5 and 10. The remaining pins 1-4, 6-9 and 11-14 are inserted in the bottom B by means of feedthrough insulators for which glass is generally used. These insulators are indicated in FIG. 1 by means of circles around the pins 1-4, 6-9 and 11-14.

This module further includes a copper cooling block CB whose bottom side is coupled thermally and electrically to the bottom B of the casing by means of an L-shaped cooling plate CP which is thermally and electrically connected to the bottom B and to the short casing side wall $SW_4$ to which a flare FL is attached for mechanically and thermally coupling the module to a larger cooling body, which is not further represented in FIGS. 1 and 2. The top side of the copper cooling block CB is connected thermally and electrically to a sheet-like metal base carrier BC.

The metal base carrier BC accommodates a first sub-carrier $SC_1$ for a laser diode LD. FIG. 1 and FIG. 2 show a current design of this sub-carrier $SC_1$ having a U-shaped profile of the cross-section along a vertical line in FIG. 1. This U-shaped profile is composed of an L-shaped metal constituent part, which is electrically conductive, connected to the base carrier, and a spacer of electro-insulating material (for example, $Al_2O_3$) whose top accommodates an electric contact face. The laser diode LD is arranged on the L-shaped metal part of the sub-carrier $SC_1$, whereas its anode is electrically connected to this metal part. The cathode of laser diode LD is connected to the electric contact face on the insulating spacer via a connecting wire and this contact face is also connected to pin 9 via a connecting wire.

The metal base carrier BC also accommodates a second sub-carrier $SC_2$ for a photodiode PD. The sub-carrier $SC_2$ consists of insulating material (for example, $Al_2O_3$) accommodating two guide tracks for connecting the photodiode PD to the pins 7 and 8 by means of wires. The photodiode PD is arranged on the side face of sub-carrier $SC_2$ in a manner such that the photodiode PD faces the rear facet of the laser diode LD on sub-carrier $SC_1$ and captures a light beam emerging from this rear facet.

In addition, on the metal base carrier BC a support S is realized for arranging the glass fiber F in a manner such that its end faces the front facet of the laser diode LD. The way of arranging the glass fiber F on support S and the way of coupling the end of glass fibre F to the front facet of laser diode LD are of minor importance to the present invention and are therefore not shown further.

The average optical power applied to the glass fiber F by the laser diode LD can be monitored and stabilized in a known manner by means of the photodiode PD capturing the light beam emerging from the rear facet of the laser diode LD. The electric circuits used for this monitoring and stablizing, are of minor importance to the present invention and will therefore not be described further, the more so as these circuits are widely known. Alternatively, it is certainly important to know how the electric circuit elements are connected to the guide pins 1-14 of the laser diode module as shown in FIGS. 1 and 2. In practice this module is arranged on one side of a printed circuit board and the guide pins 1-14 protruding from this board are connected to guide tracks on the other side of the board which lead to the electric circuit elements to be connected to the module. The connection points for the guide pins 1-14 on the printed circuit board thus have the same standardized DIL order as these pins 1-14.

If the laser diode module described hereinbefore is used for optical communication systems having bit rates exceeding 565 Mbit/s, it appears that from a bit rate of about 1 Gbit/s not so much the laser diode LD, but rather the laser diode module as a whole forms the constraining factor for performance. This implies that attention should not only be given to the thermal and mechanical characteristics of the module, but also to its electrical characteristics for higher frequencies.

Figure 3:
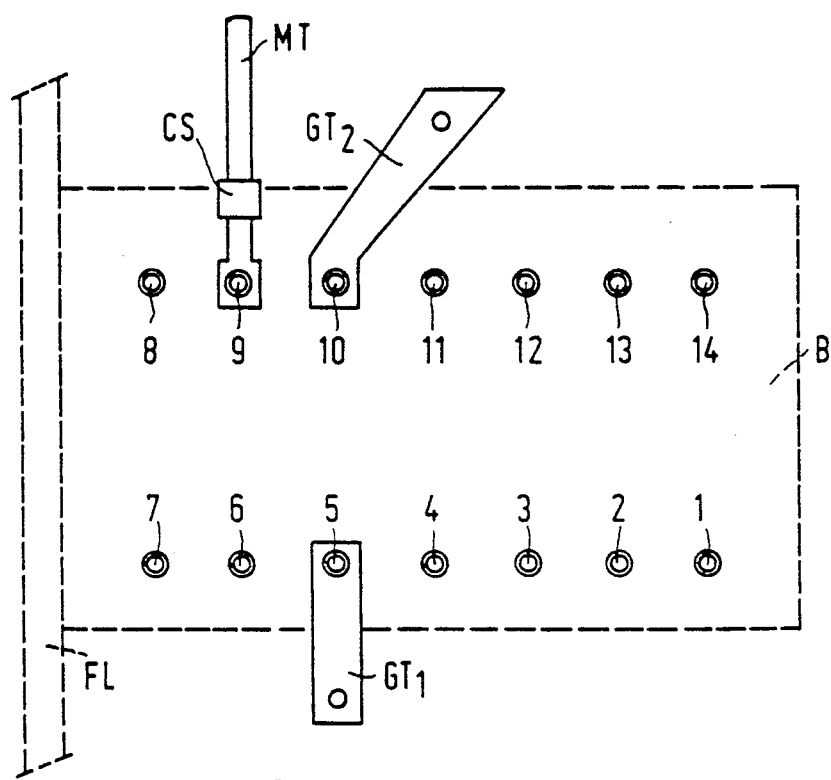
FIG. 3 shows a plan view of a specific printed wiring circuit used for measuring the high-frequency electrical properties of the laser diode module in FIG. 1.

Extensive examination of the cause of the declining performance at higher bit rates has led to the conclusion that the high-frequency electrical behavior of a laser diode module itself can be determined by arranging this laser diode module in a so-called free environment, which is to say that the laser diode module according to FIG. 1 is installed on one side of a printed circuit board on which on the other side only the guide tracks for the electric connection of the laser diode LD itself are arranged. FIG. 3 shows a plan view of this special printed circuit board with the guide tracks $GT_1$ and $GT_2$ for connecting the pins 5 and 10 which are connected to the bottom B of the module, and a guide track MT for connecting the pin 9 which is connected to the cathode of the laser diode LD. In FIG. 3 is shown, in dashed lines, how the module is attached to the bottom of this special printed circuit board, but not how the flare FL of the module is coupled thermally and mechanically to a relatively bulky cooling body. In FIG. 3 is also shown how the guide tracks $GT_1$ and $GT_2$ comprise connection points for a feed-through to the conductive layer covering the bottom side of this board with the exception of the vicinity of the module-bottom B, but this layer itself is not represented. In FIG. 3 guide track MT together with the conductive layer at the bottom forms a microstrip line having a characteristic impedance of 50 Ohms. In order to attain a reasonable coupling between this laser diode module and this microstrip line, the printed circuit board in FIG. 3 comprises a so-called chip resistor CS for surface mounting by means of which the guide track MT is connected to the connection point for pin 9 of the module.

The manner in which the printed circuit board of FIG. 3 is connected in a measuring arrangement will not be described here since this manner is widely known. It is observed, however, that a laser driving circuit is connected to the microstrip line of FIG. 3 and that measures are taken to match the output impedance of this laser driving circuit to the characteristic impedance of the microstrip line so that signal reflections at this connection point are avoided.

By means of the printed circuit board described hereinbefore the absolute value $|R|$ is measured of the reflection coefficient of the laser diode module according to FIG. 1 and FIG. 2. The laser diode LD used in this measurement is a 1.3 μm DCPBH (Double Channel Planar Buried Heterostructure) Fabry-Perot laser. A constant setting current is applied to this laser diode LD, on which current an alternating current having a relatively small amplitude is superimposed. The frequency of this alternating current is varied over a wide range from 10 MHz to 5 Ghz.

Since the losses in the microstrip line of FIG. 3 may be totally discarded in practice, the absolute value $|R|$ of the reflection coefficient R of the laser diode module is equal to the absolute value $|R|$ of the reflection coefficient $R_1$ measured at the connection point of the microstrip line in the laser driving circuit. At this connection point the absolute value $|R_1|$ of the reflection coefficient $R_1$ in the direction of the laser diode module is measured by means of a network analyzer.

Figure 4:
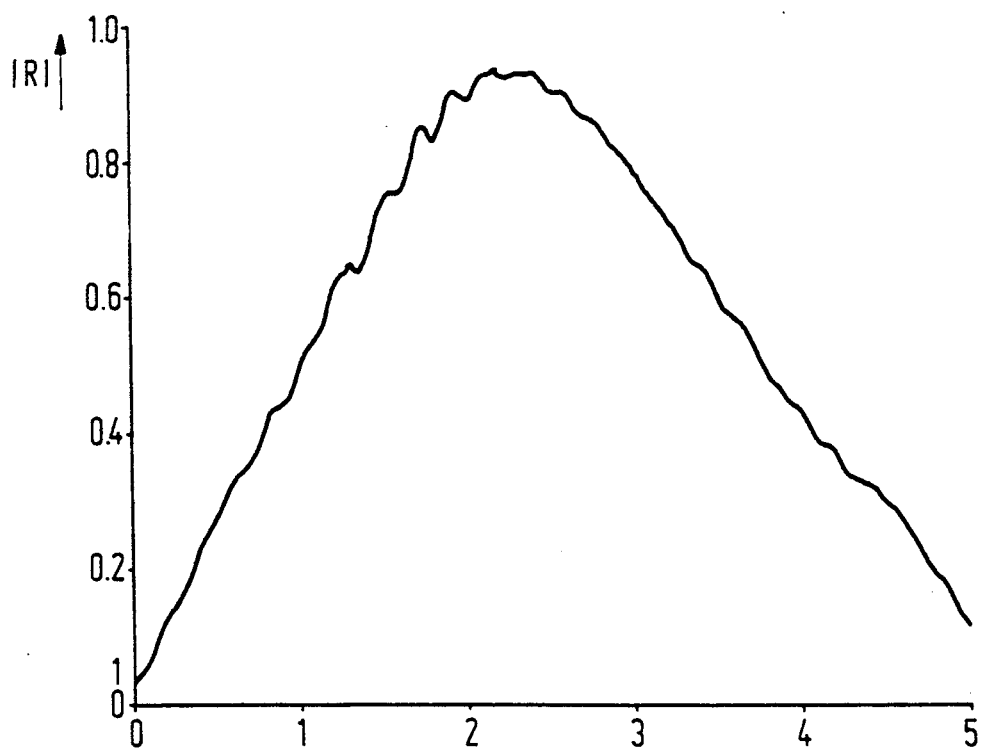
FIG. 4 shows a frequency diagram to illustrate the absolute value of the reflection coefficient of the laser diode module in FIG. 1.

In the frequency diagram of FIG. 4 the measured absolute value $|R|$ of the reflection coefficient of the module is plotted against the frequency f in GHz for a laser diode of the type discussed hereinbefore having a setting current of 70 mA and for a value of 44 Ohms of the resistor CS to match the microstrip line and the characteristic impedance of 50 Ohms.

FIG. 4 shows that the reflection coefficient $|R|$ has a value of 0.5 at a frequency of 1 GHz and a value of 0.65 at a frequency of 1.25 GHz. At bit rates of 1 to 1.25 Gbit/s considerable reflections of the input signals will occur at the connection point to the transmission line on the laser diode module.

The cause of this variation may be explained with reference to the equivalent electric circuit of the laser diode module in the so-called free environment which is used during this measurement of the absolute value $|R|$ of the reflection coefficient R. This equivalent electric circuit is represented in FIG. 5 and the structure thereof can be explained in the following manner.

The connecting line from pin 9 to the first sub-carrier $SC_1$ consists of the series connection of three portions that form inductances: of pin 9 a portion located outside the casing and having an inductance $L_{e9}$, of pin 9 a portion located inside the casing and having inductance $L_{i9}$, as well as a connecting wire between pin 9 and the electric contact face on the top side of the insulating spacer of the sub-carrier $SC_1$ having an inductance $L_{b9}$. The pin 9 is conductively fed through the bottom B of the casing by means of a feedthrough insulator forming a capacitance $C_{t9}$ between the connection point of the inductances $L_{e9}$, $L_{i9}$ and the bottom B. The bottom B is connected to pins 5 and 10 of which, in FIG. 5, a portion of pin 5 having inductance $L_{e5}$ is represented for illustration. Furthermore, the bottom B is connected to the base carrier BC by means of the copper cooling block CB. The copper cooling block CB has a very small conductance $L_{CB}$.

Figure 5:
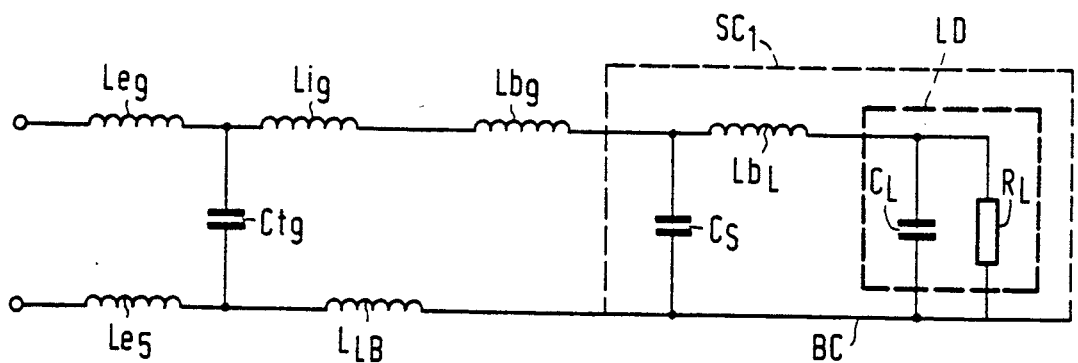
FIG. 5 shows an equivalent circuit diagram of the laser diode module of FIG. 1.

The base carrier BC may also be considered a conductor which even at relatively high frequencies still has a negligibly small impedance and which is represented in FIG. 5 as a solid line. The laser diode LD installed on the first sub-carrier $SC_1$ may initially be modelled as the parallel arrangement of a capacitor $C_L$ and a resistor $R_L$, whereas one end of the parallel arrangement in FIG. 5 is connected to the line BC, because the impedance of the conductive connection between the anode of laser diode LD and base carrier BC via the metal part of the sub-carrier $SC_1$ is still negligibly small even at relatively high frequencies. The connecting wire between the cathode of laser diode LD and the electric contact face on the top side of the insulating spacer of sub-carrier $SC_1$ forms an inductance $Lb_L$ and this insulating spacer between the contact face and the metal part of sub-carrier $SC_1$ forms a capacitance $C_S$ between the connection point of the inductances $Lb_L$ and $Lb_9$ and the base carrier BC.

The values of the circuit elements shown in FIG. 5 are represented in the table below. These values have been obtained from computations and/or impedance measurements of the module in the aforedescribed free environment.

| | |
|---|---|
| $L_{e5}$, $L_{e9}$ | 1 nH |
| $L_{i9}$ | 3 nH |
| $Lb_9$ | 2 nH |
| $Lb_L$ | 0.8 nH |
| $C_{t9}$ | 0.6 pF |
| $C_S$ | 0.2 pF |
| $C_L$ | 5 pF |
| $R_L$ | 6 Ohms |
| $L_{CB}$ | 1.5 nH |

In particular, the frequency characteristic of the absolute value $|R|$ of the reflection coefficient in FIG. 4 is associated with the inductances $L_{e5}$, $L_{CB}$, $L_{e9}$, $L_{i9}$, $Lb_9$ and $Lb_L$. For low frequencies these inductances have virtually no effect on the reflection coefficient because of their extremely small values. The selected value of 44 Ohms of the chip resistor CS together with the impedance of the laser diode of 6 Ohms provide an eminent coupling of the laser diode module to the transmission line in the form of a microstrip line having a characteristic impedance of 50 Ohms. The reflection coefficient is then practically equal to zero. At higher frequencies the impedances corresponding with the above inductances will increase, so that the impedances of the laser diode module and the microstrip line between the laser driving circuit and the laser diode module are not matched to one another. Reflections between the laser diode module and the microstrip line may then occur and lead to signal distortion. This will result in a constraint of the frequency range in which the laser diode module may be used.

For low values of the frequency the characteristic of the absolute value $|R|$ of the reflection coefficient R may be approached by $\omega L$ with $\omega = 2\pi f$ and with L being equal to the total inductance of the signal path in the laser diode module. The fact that the absolute value $|R|$ of the reflection coefficient R in FIG. 4, after reaching a maximum value of approximately 0.95, again drops to about 0.1, may be explained from the fact that the chip resistance CS in FIG. 3 is connected to pin 9 by means of a short section of microstrip line. This section is formed by a small part of guide track MT together with the conductive layer on the bottom side of the plate in FIG. 3. The input impedance of this short section of microstrip line in the direction of the module depends on the wavelength $\lambda$ of the incoming signal. If the length of this short section of microstrip line is equal to 0 or a multiplicity of $\lambda/2$, the input impedance of this short section will virtually be equal to zero. However, if the length of this section is equal to $\lambda/4$ or a multiplicity of $\lambda/2$ added thereto, the input impedance of the short section of microstrip line will assume a very high value. The absolute value $|R|$ of the reflection coefficient R which is related to the input impedance of the microstrip line in a known manner will, if the length of the short section of microstrip line is increased from 0 to $\lambda/4$, also rise from 0 to about 1, and then again drop to about 0 if the length of the short section of microstrip line is increased from $\lambda/4$ to $\lambda/2$. This process will be repeated with a periodic length of $\lambda/2$.

In accordance with the invention the reflection coefficient is now reduced by mounting an outer guide inside the casing around the pin (pin 9) which is connected to the laser diode by means of an conducting line, which guide is conductively connected to the casing, so that a coaxial transmission line is created. By suitably selecting the ratio between the inside diameter of the outer guide and the outside diameter of the inner guide (pin 9), with a given value of the dielectric constant of the medium between the guides, the characteristic impedance of the coaxial transmission line can be matched to that of the microstrip line between the laser driving circuit and the laser diode module. The module which is slightly modified as described above is thus suitable for use in systems having considerably higher bit rates than can be achieved with the existing laser diode module.

Figure 6:
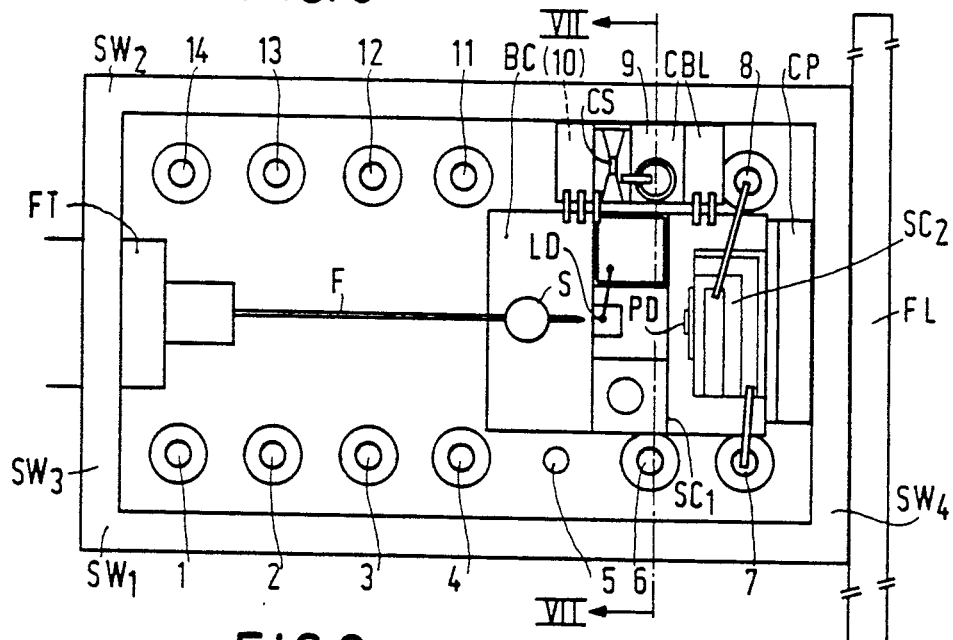
FIG. 6 shows a plan view of an embodiment of the laser diode module without a thermoelectric cooler according to the invention.
Figure 7:
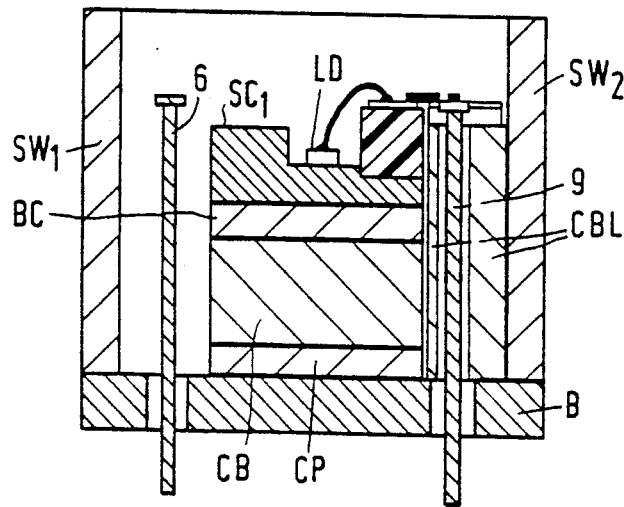
FIG. 7 shows a sectional view of the same laser diode module along the line VII—VII in FIG. 6.

An embodiment for a laser diode module according to the invention is shown in FIG. 6 and FIG. 7, FIG. 6 showing a simplified plan view and FIG. 7 a simplified sectional view along the line VII—VII in FIG. 6. Corresponding elements in FIG. 1, FIG. 2, FIG. 3, FIG. 6 and FIG. 7 are designated by the same reference numerals.

As shown in FIG. 7, pin 9 forms the inner guide of the coaxial transmission line whose outer guide is formed by a block CBL of conductive material, in which a circular cylindrical feedthrough is provided to house the pin 9. This block CBL has a flat side face which is conductively connected over its entire surface to the side wall $SW_2$ of the module casing and is further connected to the bottom B by means of ground pin 10, as is represented symbolically in FIG. 6. The inside diameter of the feedthrough is chosen such that the characteristic impedance of the coaxial transmission line is equal to that of the external microstrip line, in the example described thus equal to 50 Ohms. The original chip resistor CS positioned outside the casing is now installed inside the casing in a connecting line between the end of pin 9 and laser diode LD. In FIGS. 6 and 7 this resistor CS is arranged on a head face of the block CBL with an intermediate circuit of electro-insulating material, on which electric contact faces are arranged for connecting resistor CS to pin 9 and to the laser diode LD, the latter connection being realized by means of a connecting line to the electric contact face on the insulating spacer of the base carrier BC and from there to the laser diode LD. In practice this chip resistor CS is obtained by realizing a thin sheet of ceramic material on this head face of block CBL and providing a planar resistor on the top side of this sheet.

The conducting block CBL in FIG. 6 is realized such that the distance from the block to the side wall $SW_2$ is slightly smaller than the distance between the side wall $SW_2$ and the facing side of the base carrier BC. The head face of the middle section comprising the feedthrough for pin 9 and the adjacent resistor CS is further positioned at the same height as the top side of the insulating spacer of the sub-carrier $SC_1$, while the head faces on either one of the two sides of this middle section are level with top side of the base-carrier BC. These measures enable the use of relatively short electric connections between the end of pin 9 and resistor CS and between the resistor CS and the contact face on the insulating spacer of sub-carrier $SC_1$, which connecting lines are preferably arranged as relatively wide strips to provide the lowest possible inductances. The same holds for the connection bridging the interstice between the base carrier BC and the head faces of block CBL on either one of the two sides of its middle section, which connection is realized in FIG. 6 by means of four relatively wide connecting strips.

The value of the chip resistor CS is approximately 44 Ohms, so that for a relatively large frequency range the sum of the impedances of the chip resistor CS, laser diode LD and connecting lines is virtually equal to the characteristic impedance of the coaxial transmission line. The coaxial transmission line is directly connected to the external microstrip line between the laser driving circuit and the laser diode module by means of inductance $Le_9$.

As shown in FIGS. 6 and 7 the outer guide of the coaxial transmission line is realized in the form of a conducting block CBL having a flat side face which is conductively connected over its entire surface to the long side wall $SW_2$ of the casing. If the block CBL is not connected to the side wall $SW_2$ a small stray capacitance will occur between the conducting block CBL and the side wall $SW_2$. However, this capacitance will start to play a major role only at very high frequencies, so that this phenomenon is of minor importance. Thus it is certainly not necessary for the conducting block CBL to be connected to the side wall $SW_2$ to obtain proper operation of the module according to the invention.

The equivalent electric circuit of the laser diode module modified thus corresponds with FIG. 5 in the case of a module in a free environment according to FIG. 3, but showing the difference that now the resistor CS is connected in series with the inductances $Li_9$ and $Lb_9$ and the latter is the total inductance of the connecting line between pin 9 and the contact face on the insulating spacer of sub-carrier $SC_1$ via resistor CS. By implementing the measures described hereinbefore the inductance $Li_9$ is substantially eliminated, whereas the inductance $Lb_9$ is reduced considerably. The sum of the inductances $Li_9$ and $Lb_9$ in the original module according to FIG. 1 and FIG. 2 has a value of 5 nH whereas the inductance $Lb_9$ in the modified module according to FIG. 6 and FIG. 7 has a value of about 1 nH, so that the absolute value $|R|$ of the reflection coefficient will not reach a value of 0.65 until a much higher frequency than 1.25 Ghz is reached.

Figure 8:
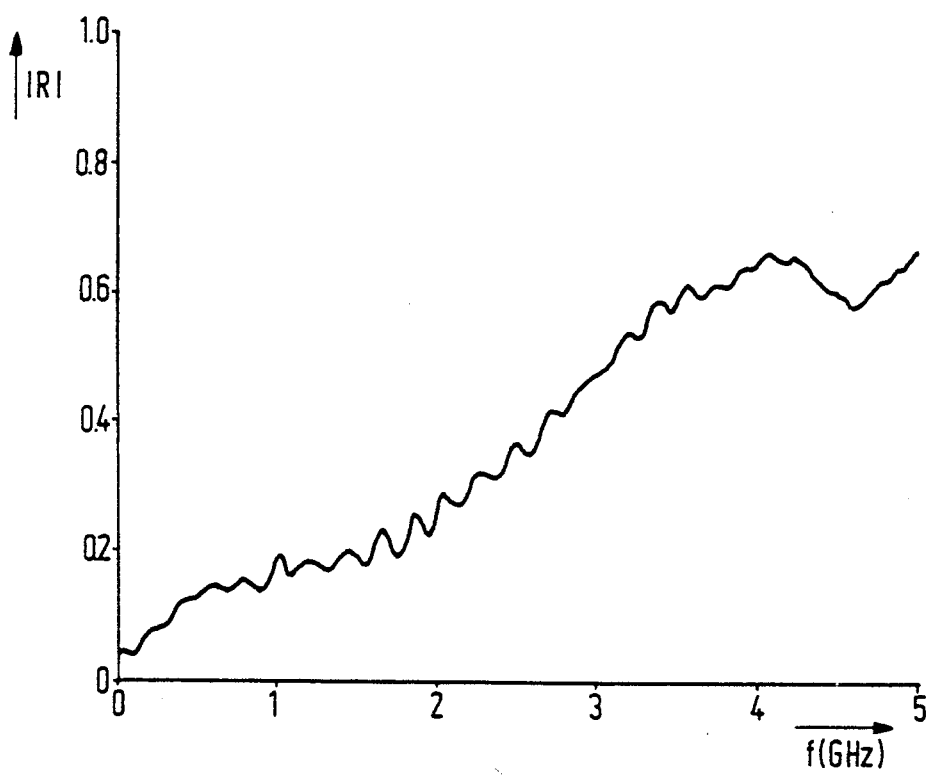
FIG. 8 shows a frequency diagram to illustrate the absolute value of the reflection coefficient of the laser diode module in FIG. 6.

The frequency diagram of FIG. 8 shows in the same way as FIG. 4 the absolute value |R| of the reflection coefficient of the modified laser diode module according to FIG. 6 and FIG. 7 in the same conditions of free environment as applied to the original laser diode module according to FIG. 1 and FIG. 2, so that the effect of the measures according to the invention may be clearly shown. FIG. 8 shows that, as expected, the absolute value |R| of the reflection coefficient over a wide frequency range is much smaller than with the laser diode module according to FIG. 4. For example, in FIG. 4 the absolute value |R| of the reflection coefficient R has a maximum value of 0.95, as compared to FIG. 8, in which the maximum value |R| is 0.65. The absolute value of the reflection coefficient in FIG. 8 will not reach the value of 0.65 until a frequency of approximately 4.0 GHz is reached, whereas the absolute value of the reflection coefficient in FIG. 4 will have reached the value of |R| =0.65 at a frequency of 1.25 GHz.

Figure 9:
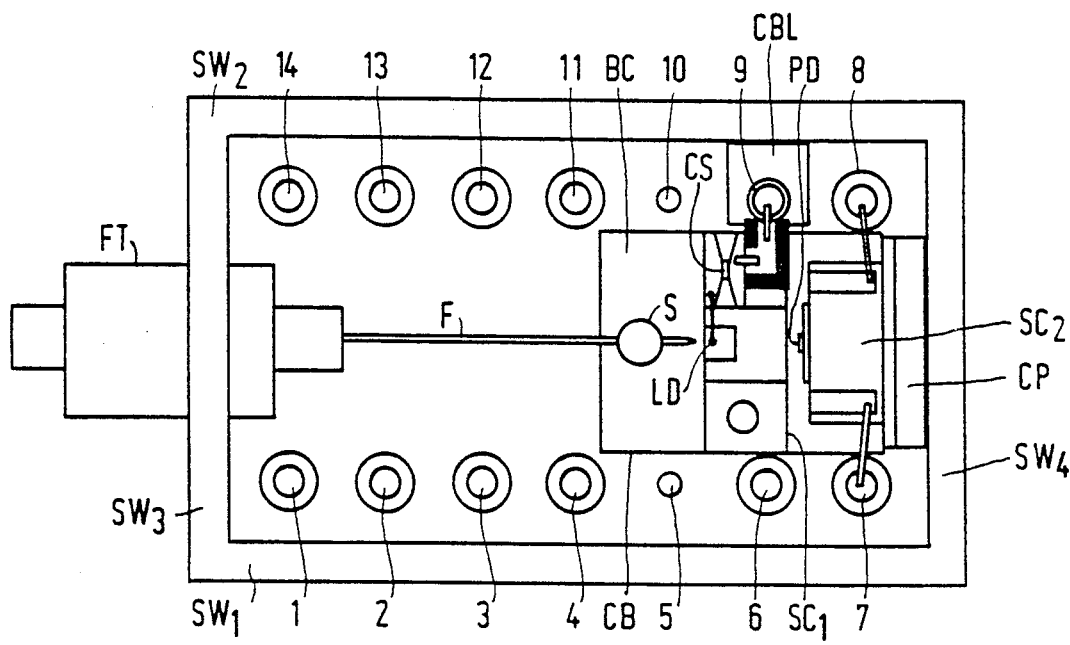
FIG. 9 shows a plan view of a second embodiment of a laser diode module without a thermoelectric cooler according to the invention.

FIG. 9 shows a plan view of a second embodiment of a laser diode module according to the invention. Corresponding elements in FIGS. 6 and 9 are designated by the same reference numerals.

As in FIG. 6 pin 9 forms the inner guide of a coaxial transmission line whereas the outer guide of the coaxial transmission line is formed by a conducting block CBL mounted around pin 9. In contradistinction with the embodiment of FIG. 6 the dimensions of the block CBL in FIG. 9 are so small as to have no contact between block CBL and pin 10. The chip resistor CS is not installed on the conducting block CBL either, but is installed on the top side of an insulating spacer (of smaller size than in FIG. 6) of the sub-carrier $SC_1$, having electric contact faces on either side of the resistor CS, the one contact face being connected to the laser diode LD by means of a connecting line and the other contact face being connected to the inner guide (pin 9) of the coaxial transmission line by means of the narrow strip guide of a microstrip line. FIG. 9 does not show how, besides the insulating spacer, the metal part of this sub-carrier $SC_1$ is connected to the outer guide (block CBL) of the coaxial transmission line. Owing to these measures the total inductance of the signal path inside the laser diode module is smaller than when realizing the laser diode module according to the invention as shown in FIGS. 6 and 7. Consequently, the frequency characteristic of the reflection coefficient belonging to this embodiment shows even smaller values than the characteristic of the reflection coefficient in FIG. 8.

In the embodiment for the laser diode module according to the invention, as shown in FIG. 9, the chip resistor CS is installed more remote from the casing, from a thermoconductive point of view, than is the case in the first embodiment of the laser diode module according to the invention and shown in FIGS. 6 and 7. The heat dissipation produced in the chip resistor CS in the module according to FIG. 9 is effected by means of sub-carrier $SC_1$ for the laser diode LD. This may cause a problem because if the heat is not dissipated fast enough this will lead to undesirably high temperatures of the laser diode LD with all its injurious consequences.

Figure 10:
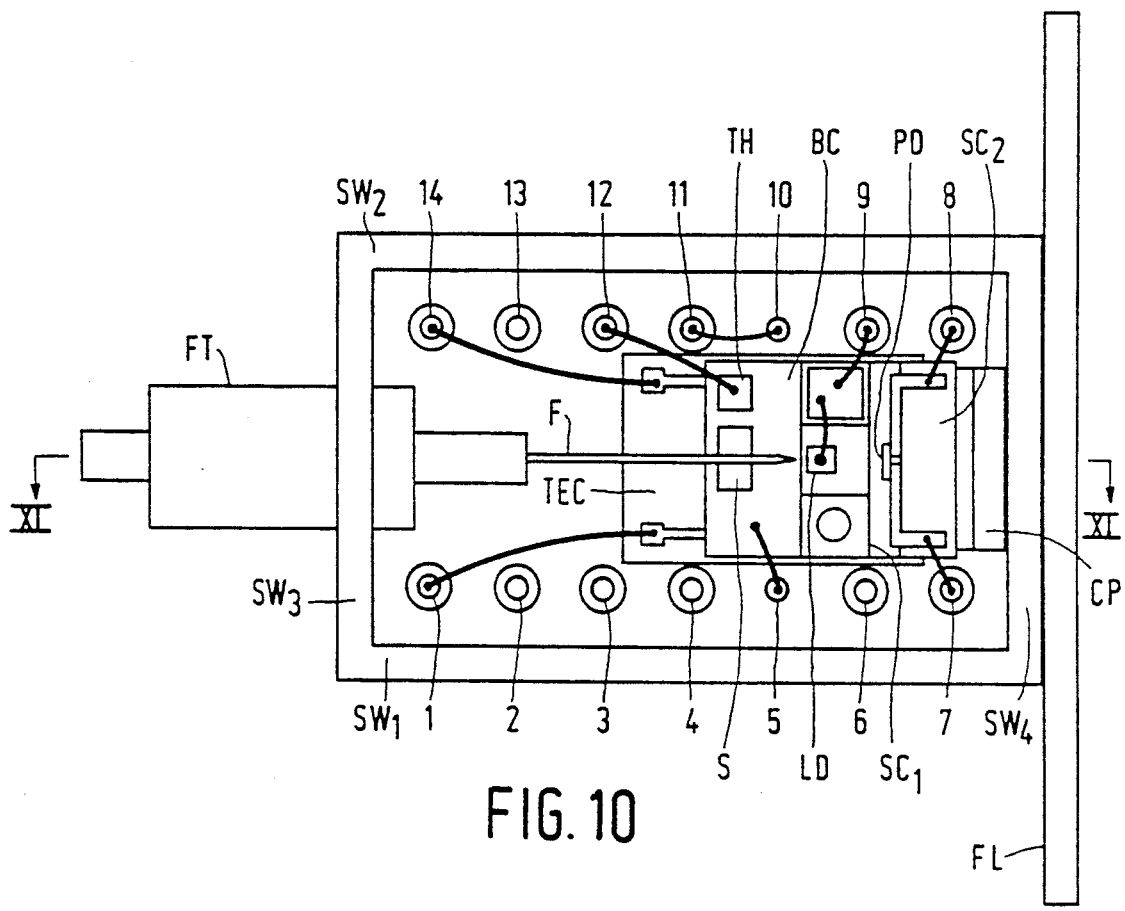
FIG. 10 shows a plan view of a laser diode module with a prior-art thermoelectric cooler.
Figure 11:
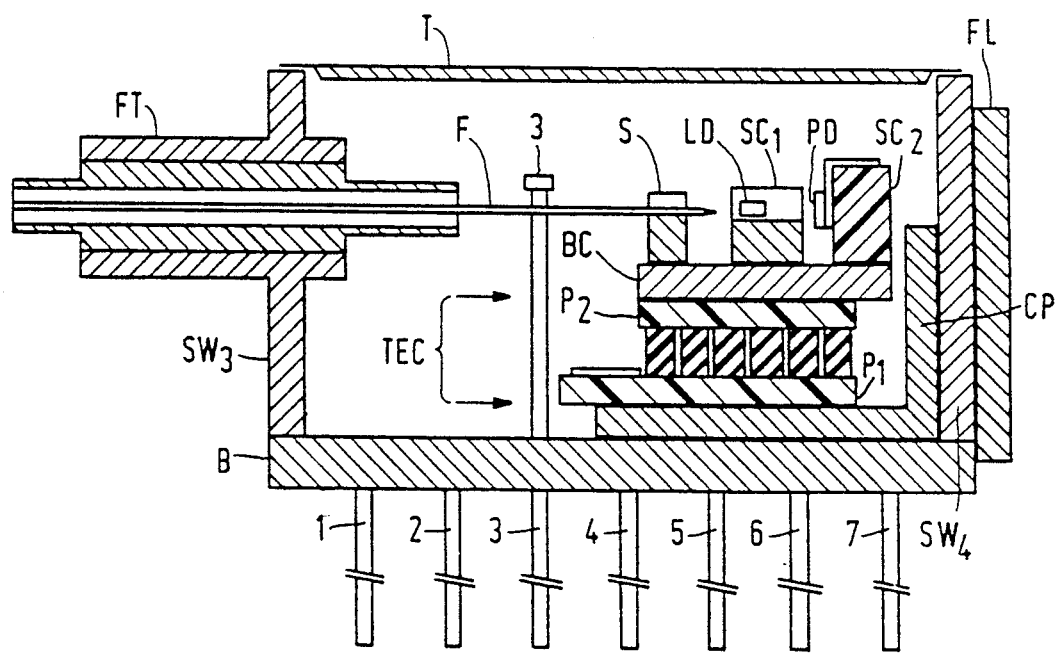
FIG. 11 shows a sectional view of the same laser diode module along the line XI—XI in FIG. 10.

The description of the preceding FIGS. 1 to 9 relates to a laser diode module not comprising a thermoelectric cooler. The necessary cooling of the module was obtained by using a relatively bulky cooling block CB inside the casing and connecting the flare FL to a larger cooling body erected outside the module. However, if stiff requirements are made on the stability of the temperature of the laser diode LD, laser diode modules having a thermoelectric cooler inside the casing are preferably used. FIGS. 10 and 11 show an embodiment for a laser diode module having such an active cooling element, whereas FIG. 10 shows a plan view and FIG. 11 a sectional view along the lines XI—XI. Corresponding elements in FIGS. 1, 2, 10 and 11 are designated by the same reference numerals.

The thermoelectric cooler TEC in this embodiment is formed by a Peltier cooler having a bottom plate $P_1$ and a top plate $P_2$ of ceramic material which is highly thermoconductive but insulates electrically. Between these plates $P_1$, $P_2$ rod-shaped elements of semiconductor material are inserted operating as p-n junctions and being connected in series by means of guide tracks on the top side of the bottom plate $P_1$ and the bottom side of the top plate $P_2$. This series connection of p-n junctions is connected between the pins 1 and 14 by means of connecting wires which are indicated in FIG. 10 by means of solid lines—as are the remaining connecting wires of the module. The bottom side of the bottom plate $P_1$ forms a thermal contact face of the thermoelectric cooler TEC which is thermoconductively coupled to the bottom B of the casing by means of an L-shaped cooling plate CP which is thermoconductively connected to the bottom B and to the short side wall $SW_4$ of the casing, on which a flare FL is provided for coupling the module mechanically and thermally to a larger cooling body which is not further shown in FIGS. 10 and 11. The top side of the bottom plate $P_2$ likewise forms a thermal contact face which is thermoconductively connected to the sheet-like metal base carrier BC.

The metal base carrier BC further accommodates a thermistor TH which is thermally coupled to this base carrier. One end of thermistor TH is connected to pin 12 by means of a connecting wire and in this case the other end is connected, also conductively, to the metal base carrier BC.

The metal base carrier BC itself is connected to pin 5 by means of a connecting wire. Since pin 5 is conductively connected to the metal bottom B of the casing and since the same holds for pin 10, pin 11 can then be used for connecting the second end of thermistor TH by interconnecting pins 10 and 11 by means of a connecting wire.

The above description demonstrates that the laser diode LD and the thermistor TH both have a proper thermal coupling to the bottom plate $P_2$ of the Peltier cooler TEC, as a result of which the temperature of the laser diode LD can be monitored and stablized in a known fashion.

Figure 12:
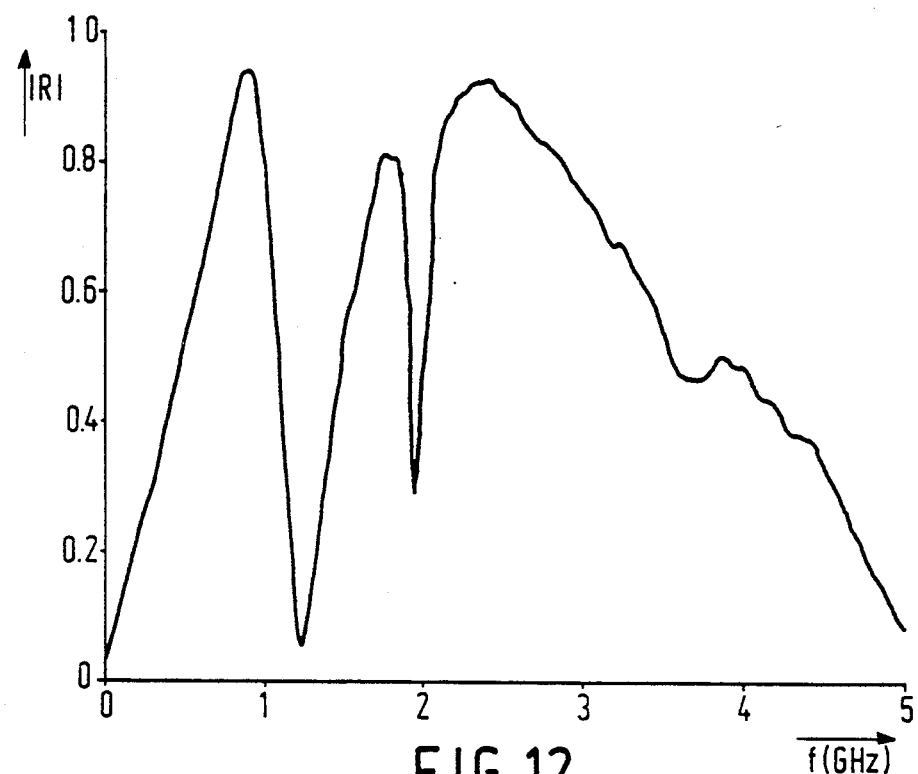
FIG. 12 shows a frequency diagram to illustrate the absolute value of the reflection coefficient of the laser diode module of FIG. 10.

In a manner corresponding with the one described with reference to FIG. 3, the reflection coefficient of the embodiment of the laser diode module as shown in FIGS. 10 and 11 is measured as a function of the frequency, while all guide pins 1-14 in this module are realized in a standard DIL arrangement. The frequency characteristic of the absolute value |R| of the reflection coefficient is shown in FIG. 12. From FIG. 12 it appears that the absolute value |R| of the reflection coefficient shows two dips at the frequencies f=1.25 GHz and f=1.95 GHz. It also appears from FIG. 12 that the reflection coefficient reaches a maximum absolute value of |R| =0.97 at a frequency of 0.9 GHz and an absolute value of |R| =0.5 at a frequency of 0.5 GHz.

Figure 13:
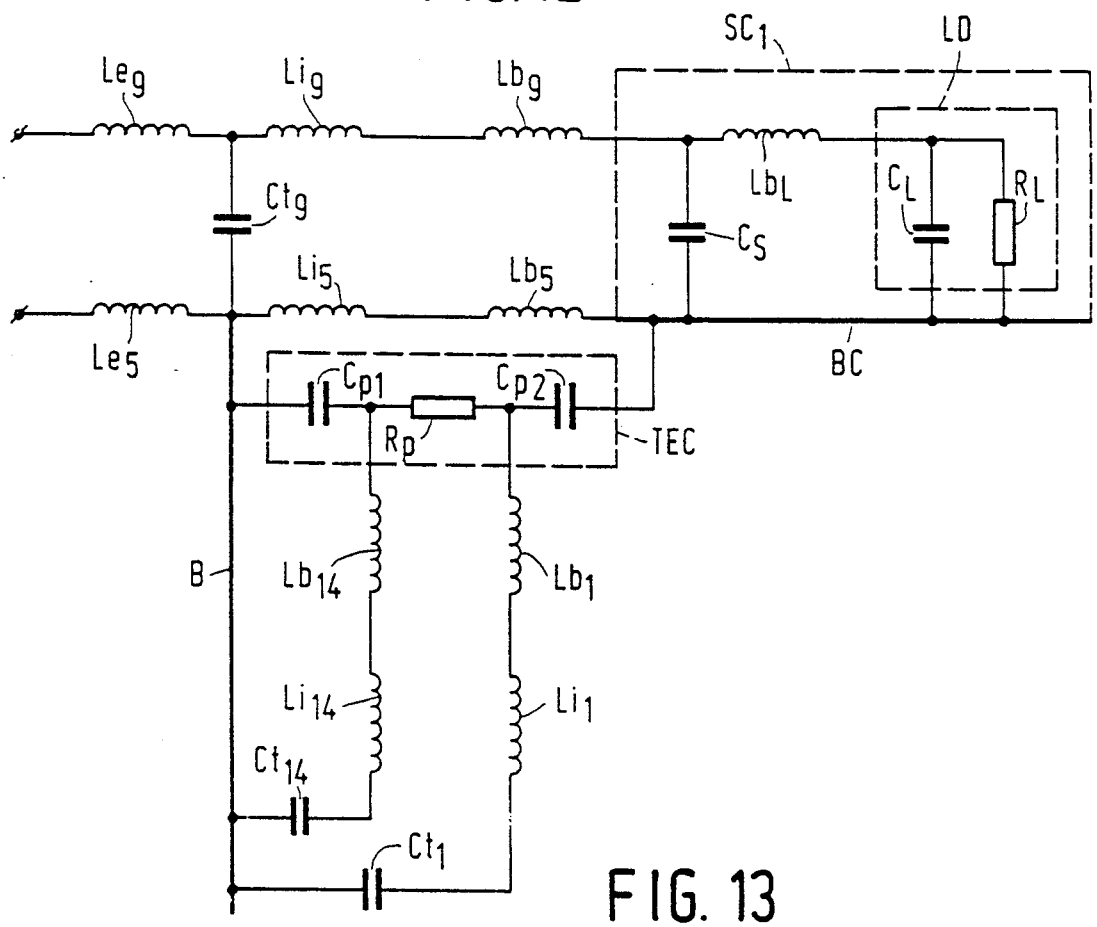
FIG. 13 shows an equivalent circuit diagram of the laser diode module of FIG. 10.

The cause of these dips in the frequency characteristic of the reflection coefficient |R| may be explained with reference to the equivalent electric circuit of the laser diode module in the so-called free environment which is used for measuring this reflection coefficient. This equivalent electric circuit is represented in FIG. 13. It comprises a number of elements also occurring in the circuit as shown in FIG. 5 and these corresponding elements in FIGS. 5 and 13 are designated by the same reference numerals.

The connecting lines from the pins 5 and 9 to the first sub-carrier $SC_1$ both consist of the series connection of three parts forming inductances: a part of the pins 5 and 9 located outside the casing and having the respective inductances $Le_5$ and $Le_9$, a part of the pins 5 and 9 located inside the casing and having the respective inductances $Li_5$ and $Li_9$, and also a connecting wire between pin 5 and the base carrier BC having an inductance $Lb_5$ and a connecting wire between pin 9 and the electric contact face on the top side of the insulating spacer of the sub-carrier $SC_1$ having an inductance $Lb_9$. The pin 5 is conductively connected to the bottom B of the casing which may still be considered a conductor having a negligibly small impedance even at relatively high frequencies and is represented in FIG. 5 as a solid line connected to the junction of the inductances $Le_5$ and $Li_5$. Alternatively, pin 9 is fed through the bottom B by means of a feedthrough insulator forming a capacitance $Ct_9$ between the junction of the inductances $Le_9$ and $Li_9$ and the bottom B.

The impedance of the Peltier cooler TEC which is situated between the base carrier BC and the bottom B of the casing may in good approximation be represented by the series connection of a capacitor $C_{p1}$, a resistor $R_p$ and a capacitor $C_{p2}$. The connecting lines from the Peltier cooler TEC to the pins 1 and 14 both consist of the series connection of two sections forming inductances: a connecting wire between the connection points of the Peltier cooler TEC and the pins 1 and 14 having respective inductances $L_{b1}$ and $L_{b14}$ which are connected to respective ends of the resistor $R_p$ (which represents the resistance of the series connected p-n junctions in the Peltier cooler TEC), as well as a part of the pins 1 and 14 having respective inductances $Li_1$ and $Li_{14}$ situated inside the casing. The pin-part situated outside the casing does not play any role in this matter because these pins 1 and 14 in the aforesaid free environment are not connected to guide tracks of the printed circuit board (compare FIG. 3). Alternatively, the feedthrough insulators in the bottom B for the pins 1 and 14 do play a role because these feedthrough insulators form the respective capacitances $Ct_{19}$ and $Ct_{14}$ between the bottom B and the ends of the respective series connections of the inductances $Li_1$, $Lb_1$ and $Li_{14}$, $Lb_{14}$.

The values of the circuit elements shown in FIG. 13 are represented in the table below. These values are obtained from computations and/or impedance measurements of the module in the free environment described hereinbefore.

| | |
|---|---|
| $Le_5$, $Le_9$ | 1 nH |
| $Li_5$, $Li_9$; $Li_1$, $Li_{14}$ | 3 nH |
| $Lb_5$, $Lb_9$ | 2 nH |
| $Lb_1$, $Lb_{14}$ | 10 nH |
| $Lb_L$ | 0.8 nH |
| $Ct_9$, $Ct_{14}$, $Ct_1$ | 0.6 pF |
| $C_S$ | 0.2 pF |
| $C_L$ | 5 pF |
| $R_L$ | 6 Ohms |
| $C_{p1}$, $C_{p2}$ | 7.6 pF |
| $R_p$ | 0.3 Ohm |

The two sharp dips in the absolute value |R| of the reflection coefficient as shown in FIG. 12 may be associated with resonance phenomena in the circuit of FIG. 13. The first dip is associated with a parallel resonance between the inductances $Li_5$, $Lb_5$ and the capacitances $C_{p1}$, $C_{p2}$, whereas the second dip may be associated with a combination of series-resonance phenomena between the inductances $Lb_1$, $Li_1$ and the capacitance $Ct_1$ respectively, the inductances $Lb_{14}$, $Li_{14}$ and the capacitance $Ct_{14}$, while allowing for the capacitance $C_{p1}$ which, for that matter, is arranged in parallel with the respective series connections ($Lb_{14}$, $Li_{14}$, $Ct_{14}$) and ($Lb_1$, $Li_1$, $Ct_1$). The parallel resonance of the first circuit occurs at a frequency of about 1.15 GHz and the series resonance of the second circuit at a frequency of about 1.9 GHz. These resonance circuits will show a capacitive behavior at frequencies exceeding the resonance frequency of their own circuit. Consequently, either one of the two resonance circuits, together with the inductances of pin 9, will produce a series resonance at a frequency exceeding their own resonance frequency. From FIG. 12 it appears that these series resonance frequencies are situated at 1.25 GHz and 1.95 GHz respectively.

Furthermore, it will be evident that also in the case of a laser diode module in a practical environment (in which in addition to the pins 5, 9 and 10 also the remaining pins 1-4, 6-8 and 11-14 are connected to the guide tracks on a printed circuit board) an equivalent electric circuit may be derived in the same manner in which the circuits of FIGS. 5 and 13 are derived from a laser diode module in a free environment as shown in FIG. 3. It will also be evident that in this practical case the frequency characteristic of the absolute value |R| of the reflection coefficient will show considerably more dips than the two in FIG. 12 and that these dips may also be associated with resonance phenomena in the equivalent electric circuit, while the stray reactances of the thermoelectric cooler TEC continue to play a role.

It may be stated that the frequency characteristic of the absolute value |R| of the reflection coefficient is determined by adjusting the impedance of the laser diode module to the characteristic impedance of the external microstrip line between the laser driving circuit and the laser diode module, and also by resonance phenomena which are associated with the presence of the thermoelectric cooler TEC in the laser diode module.

In accordance with the invention the reflection coefficient is again reduced by providing around pin 9 inside the casing an outer conductor which is connected conductively to the casing, so that a coaxial transmission line is created in which the ratio between the inside diameter of the outer conductor to the outside diameter of the inner conductor (pin 9) is chosen such that the characteristic impedance of this coaxial transmission line is equal to that of the external microstrip line between the laser driving circuit and the laser diode module. At the same time the influence of the cooler TEC on the reflection coefficient is considerably reduced according to the further invention by slightly modifying the existing casing of the laser diode module. By implementing the above measures this slightly modified module is now made suitable for use in systems having considerably higher bit rates than those attainable with the existing module.

Figure 14:
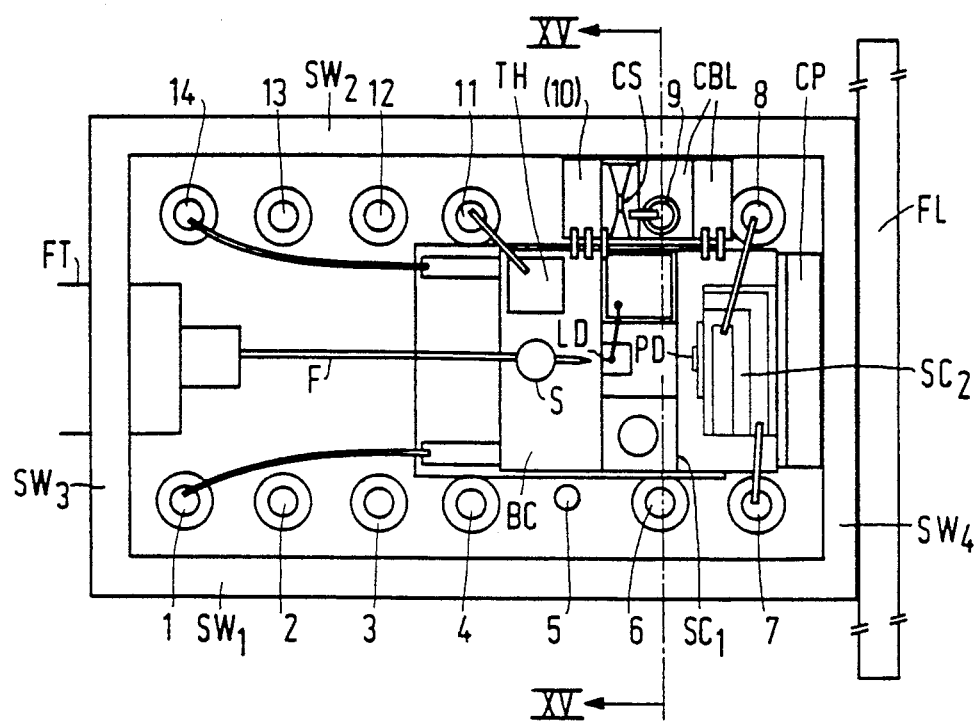
FIG. 14 shows a plan view of an embodiment of a laser diode module with a thermoelectric cooler according to the invention.
Figure 15:
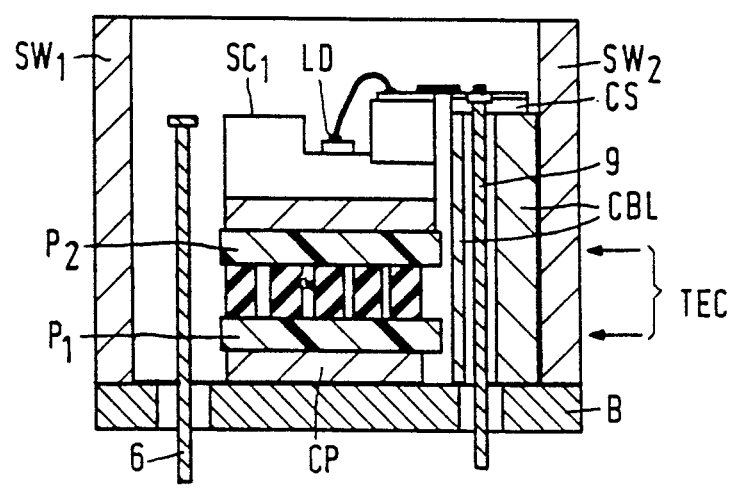
FIG. 15 shows a sectional view of the same laser diode module along the line XV—XV in FIG. 14.

An embodiment of a laser diode module according to the invention is shown in FIGS. 14 and 15, wherein FIG. 14 shows a simplified plan view and FIG. 15 a sectional view along the line XV-XV in FIG. 14. Corresponding elements in FIG. 6, FIG. 7, FIG. 10, FIG. 11, FIG. 14 and FIG. 15 are designated by the same reference symbols.

Pin 9 and block CBL in FIG. 15 are arranged in the same manner as in FIG. 6 and FIG. 7. As has been described with reference to FIG. 6 and FIG. 7, a coaxial transmission line is then created having a characteristic impedance which is equal to the characteristic impedance of the external microstrip line between the laser driving circuit and the laser diode module.

In the same manner as shown in FIG. 6, four relatively wide connecting strips for bridging the interstice between the base carrier BC and the head faces on either one of the two sides of the middle section of the block CBL are shown in FIG. 14, so that the connection between base carrier BC and block CBL has the least possible inductance.

The equivalent electric circuits of the laser diode module in FIG. 14 modified thus, corresponds with the circuit according to FIG. 13 in the case of a module in a free environment as shown in FIG. 3, but shows two differences. First the resistor CS is now connected in series with the inductances $Li_9$ and $Lb_9$, while $Lb_9$ represents the total inductance of the connection between the pin 9 and the contact face on the insulating spacer of the sub-carrier $SC_1$ through resistor CS. Secondly, the inductances $Le_5$, $Li_5$ and $Lb_5$ in the case of FIG. 14 represent the inductances of the part of pin 10 situated outside the casing and the part of the pin situated inside the casing respectively, formed by conducting block CBL and the four strips connecting block CBL to base carrier BC.

Implementation of the measures described hereinbefore with respect to FIG. 14 will virtually eliminate the inductances $Li_9$ and $Li_5$ in FIG. 13 and reduce the inductances $Lb_9$ and $Lb_5$ considerably. Consequently, the resonances caused by firstly the inductances $Li_5$, $Lb_5$ and the stray reactances $C_{p1}$, $C_{p2}$ and secondly the inductances $Lb_1$, $Li_1$, $Li_{14}$, $Lb_{14}$ and the capacitances $Ct_1$, $Ct_{14}$ as well as the capacitance $C_{p1}$ will be shifted to much higher frequencies than the 1.25 GHz and 1.95 GHz. The matching of the input impedance of the laser diode module to the characteristic impedance of the external microstrip line will also be improved considerably.

It is additionally observed with respect to the practical embodiment of the laser diode module of FIG. 14 that the inductance $Lb_5$ in FIG. 13 is extremely small because in FIG. 14 the interstices between the base carrier BC and the head faces on either one of the two sides of the middle section of the conducting block CBL are bridged by relatively wide connecting strips. For this purpose it is to be recommended to choose not too large a thickness of this connecting strip in order not to create undesired thermal coupling between the base carrier BC and the side walls $SW_1$, $SW_2$ of the casing by means of these connecting strips.

Figure 16:
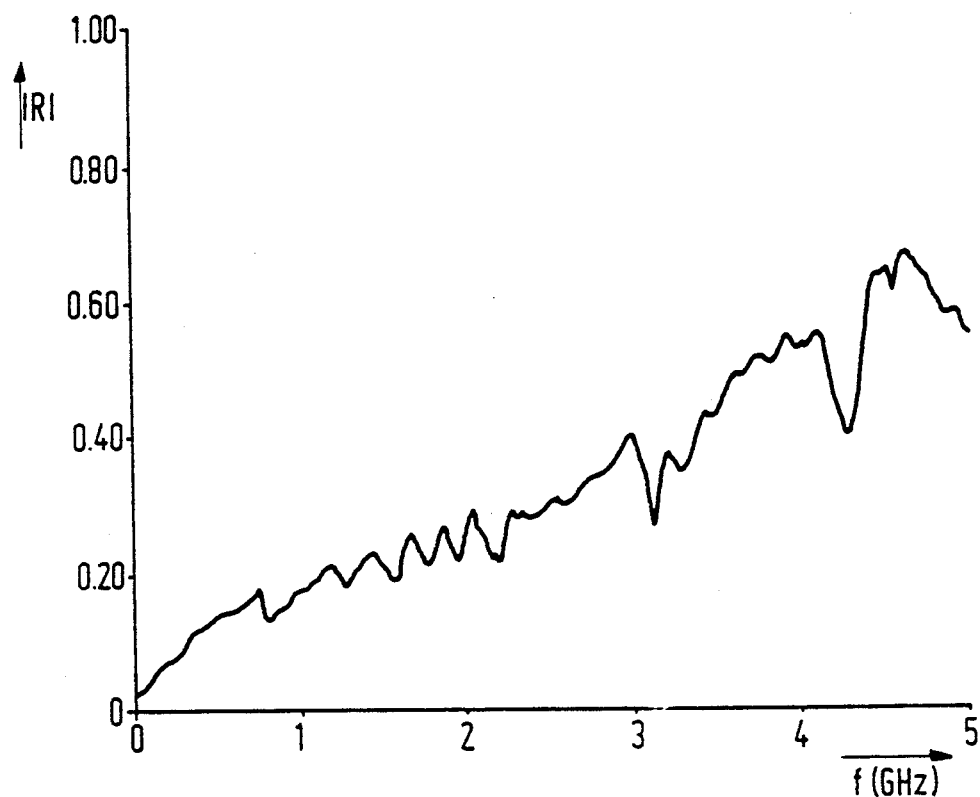
FIG. 16 shows a frequency diagram to illustrate the absolute value of the reflection coefficient of the laser diode module in FIG. 14.

The frequency diagram of FIG. 16 shows in the same manner as that of FIG. 12 the absolute value $|R|$ of the reflection coefficient of the modified laser diode module as shown in FIGS. 14 and 15 in the same free environment conditions as applied to the original laser diode module as shown in FIGS. 10 and 11, so that the effect of the modified casing may become clearly evident. As expected on the basis of the matters discussed hereinbefore, the sharp dip in the absolute value $|R|$ of the reflection coefficient, which may be associated with the parallel resonance between the inductances $Li_5$, $Lb_5$ and the stray reactances $C_{p1}$, $C_{p2}$ of the thermoelectric cooler TEC in FIG. 16 for the modified casing, occurs at a frequency of $f=3.15$ GHz, which is much higher than the value $f=1.25$ GHz in FIG. 12 for the original casing. In addition, this dip is considerably less deep than in the case of FIG. 12. The second sharp dip in the characteristic line of FIG. 12, which may be associated with phenomena of series-resonance between the inductances $Lb_1$, $Li_1$ and $Lb_{14}$, $Li_{14}$ of the connecting lines to the thermoelectric cooler TEC and the associated capacitors $Ct_1$ and $Ct_{14}$ of the feedthrough insulators in the bottom B, occurs in the characteristic line of FIG. 16 at a frequency of 4.3 GHz. This second dip is also much less deep than in the case of FIG. 12.

From the characteristic line of FIG. 16 it may be concluded that even for the laser diode module of FIG. 10 and FIG. 11 in a practical environment it will hold that undesired resonances caused by the coupling between the stray rectances of the thermoelectric cooler and the relatively high inductances of several connecting lines inside the casing of the module are either shifted to considerably higher frequencies or diminished to such an extent that they are no longer perceivable in practice as a result of the implementation of the simple measures according to the invention shown in FIGS. 14 and 15.

From FIG. 16 it appears that the absolute value $|R|$ of the reflection coefficient has a maximum value of $|R|=0.65$ at a frequency of 4.7 GHz and a value of $|R|=0.5$ at a frequency 3.7 GHz. A comparison of the frequency characteristics in FIGS. 16 and 12 makes it apparent that disturbing reflections of the input signals will occur only at much higher bit rates when the laser diode module according to the invention is used.

Figure 17:
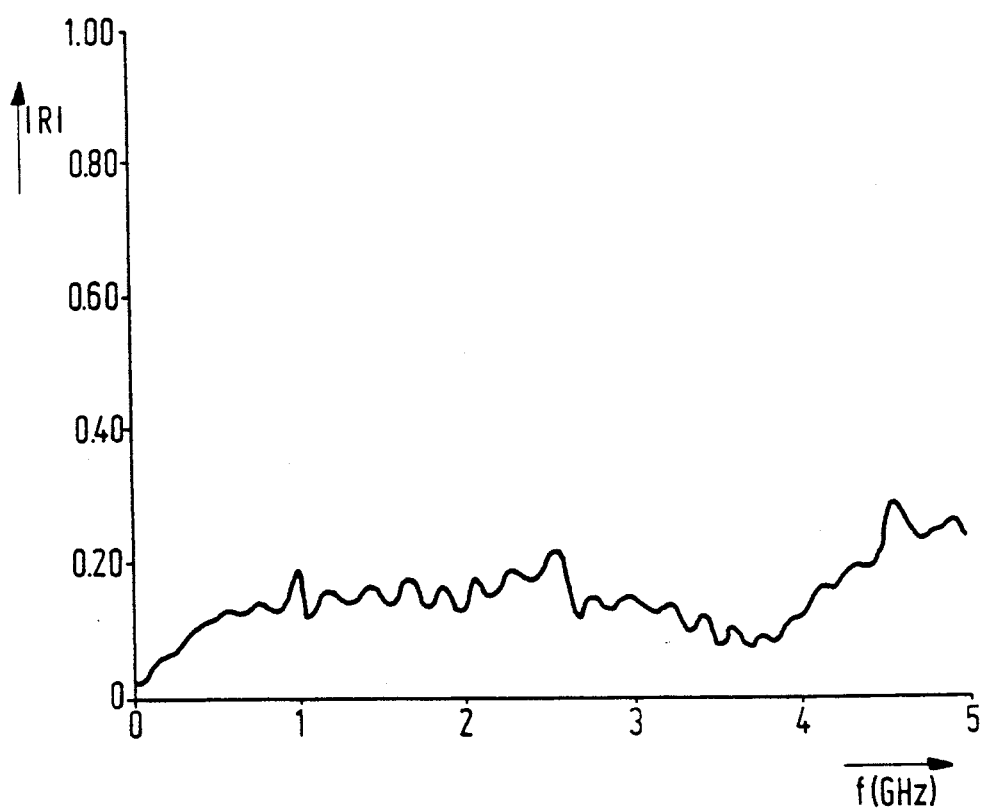
FIG. 17 shows a frequency diagram to illustrate the absolute value of the reflection coefficient of a second embodiment of the laser diode module with a thermoelectric cooler according to the invention.

In the frequency diagram of FIG. 17 the absolute value $|R|$ of the reflection coefficient is plotted against the frequency for a laser diode module of the type shown in FIG. 9, except for the fact that the laser diode module now comprises, as does the one represented in FIG. 14, the thermoelectric cooler TEC, the thermistor TH and their connecting lines to the pins 1, 14 and 11.

By analogy with the description of the FIG. 9, an improved reflection coefficient characteristic compared to the laser diode module arrangements of FIGS. 14 and 15 is obtained as a result of a reduced inductance of the connecting line between pin 9 and the laser diode LD. However, also by analogy with the description of FIG. 9, it should be observed that the dissipation of the heat produced in the chip resistor CS may pose a problem.

For completeness it should be observed that at frequencies from about 3 GHz onwards the laser diode can no longer be represented sufficiently accurately by the extremely simple model of the parallel arrangement of a capacitor and a resistor as has been used in the equivalent electric circuit of FIG. 5 and FIG. 13. The above description, however, shows that the equivalent electric circuit of FIGS. 5 and 13 has a structure which is extremely suitable to accurately represent the high frequency electrical behavior of the laser diode module as a whole.

We claim:

1. A laser diode module comprising:
   a rectangular box-shaped metal casing with a bottom, two long and two short side walls, a tubular passage for a glass fiber being provided in one of the short side walls, and in which at least six guide pins are passed through the bottom in a standardized DIL order, at least one of the guide pins being inserted in the bottom by means of an electrically conductive material and the remaining guide pins being inserted in the bottom by means of feedthrough insulators;
   a sheet-like metal base carrier having a electrically conductive coupling with the casing, on which base carrier are mounted a first subcarrier with a laser diode attached to it, a support for mounting the glass fiber in a manner such that its end faces the front facet of the laser diode, and a second subcarrier with the photodiode attached to it; and
   connecting lines for electrically connecting the laser diode, the photodiode and the metal base carrier to the respective guide pins, characterized in that the guide pin for electrically connecting the laser diode, which pin is inserted in the bottom by means of a feedthrough insulator, forms, only inside the casing and substantially throughout its entire length inside the casing, the inner guide of a coaxial transmission line whose outer guide is electrically conductively connected to the casing, and in the connecting line between the linear guide and the laser diode a resistor is inserted having a value such that the sum of the resistances of this resistor and the laser diode is substantially equal to the characteristic impedance of the coaxial transmission line.

2. A laser diode module as claimed in claim 1, characterized in that the outer conductor has at least one flat side face which is electrically conductively connected over its entire surface to the associated long side wall of the casing.

3. A laser diode module as claimed in claim 1, wherein the laser diode module further includes a thermoelectric cooler with two thermal contact faces, one of which being thermoconductively coupled to the bottom of the metal casing and the other contact face being thermoconductively connected to the base carrier, on which base carrier is installed a thermistor thermally coupled to the base carrier, and the laser diode module further includes connecting lines for electrically connecting the thermistor and the thermoelectric cooler to the respective guide pins, characterized in that inside the casing, in parallel with the long and short side walls, a rod of electrically conductive material is provided which, over its entire length, is electrically conductively connected to a long side wall of the casing, an electrical coupling also being provided between the head face of the rod and the base carrier.

4. A laser diode module as claimed in claim 2, characterized in that the outer guide of the coaxial transmission line is formed by a rod having a circular cylindrical feedthrough for the inner guide and that the head face of the rod is electrically conductively connected to the base carrier.

5. A laser diode module as claimed in claim 1, wherein an insulating spacer having at its top side at least one electrically conductive contact face is installed on the base carrier, characterized in that the resistor is installed on the top side of the spacer between the two conductive contact faces.

6. A laser diode module as claimed in claim 1, characterized in that the resistor is installed on a head face of the outer guide of the coaxial transmission line with insulating material inserted therebetween.

7. A laser diode module as claimed in claim 3, characterized in that at least one of the respective electrically conductive connections, connecting the said head face of the rod to the base carrier and the resistor to the inner guide as well as the laser diode, is realized in the form of a relatively wide connecting strip.

8. A laser diode module as claimed in claim 3, characterized in that the length of the rod is substantially equal to the distance between the bottom of the casing and the top of the base carrier.

9. A laser diode module as claimed in claim 3, characterized in that the maximum rod dimension in the direction perpendicular to the relevant long side wall of the casing is not larger than the distance between this side wall and the facing side of the base carrier.

10. A rectangular box-like metal casing suitable for use in a laser diode module as claimed in claim 1, having a bottom, two long and two short side walls, a tubular feedthrough for a glass fiber being mounted in one of the short side walls, and at least six guide pins being fed through the bottom in a standardized DIL order, at least one of the guide pins being inserted in the bottom by means of electrically conductive material and further guide pins being installed in the bottom by means of feedthrough insulators, characterized in that the guide pin intended for connecting the laser diode and inserted in the bottom by means of the feedthrough insulator forms the inner guide of a coaxial transmission line situated inside the casing, while its outer guide is electrically conductively connected to the casing.

11. A casing as claimed in claim 10, characterized in that the outer guide of the coaxial transmission line comprises at least one flat side face which over its entire surface is electrically conductively connected to the associated long side wall of the case.

12. A casing as claimed in claim 11, characterized in that the outer guide of the coaxial transmission line is formed by a rod having a circular cylindrical feedthrough for the inner guide.

13. A casing as claimed in claim 11, characterized in that the length of the outer guide of the coaxial transmission line is substantially equal to the distance between the bottom and the casing of the top of a base carrier of the laser diode module to be installed inside the casing.

14. A casing as claimed in claim 10, characterized in that the maximum dimension of an outer guide of the coaxial transmission line in the direction perpendicular to the associated long side wall of the casing is not larger than the distance between this side wall and the facing side of the base carrier to be installed inside the casing.

15. A laser diode module as claimed in claim 2, wherein the laser diode module further includes a thermoelectric cooler with two thermal contact faces, on of which being thermoconductively coupled to the bottom of the metal casing and the other contact face being thermoconductively connected to the base carrier, on which base carrier is installed a thermistor thermally coupled to the base carrier, and the laser diode module further includes connecting lines for electrically connecting the thermistor and the thermoelectric cooler to the respective guide pins, characterized in that inside the casing, in parallel with the long and short side walls, a rod of electrically conductive material is provided which, over its entire length, is electrically conductive connected to a long side wall of the casing, an electrically coupling being provided between the head face of the rod and the base carrier.

16. A laser diode module as claimed in claim 15, characterized in that the outer guide of the coaxial transmission line is formed by a rod having a circular cylindrical feedthrough for the inner guide and that the head face of the rod is electrically conductively connected to the base carrier.

17. A laser diode module as claimed in claim 3, characterized in that the outer guide of the coaxial transmission line is formed by a rod having a circular cylindrical feedthrough for the inner guide and that the head face of the rod is electrically conductive connected to the base carrier.

* * * * *